US005560090A

United States Patent [19]
Komakine et al.

[11] Patent Number: 5,560,090
[45] Date of Patent: Oct. 1, 1996

[54] METHOD OF FABRICATING INK JET PRINT HEAD

[75] Inventors: Shigeo Komakine; Kuniaki Ochiai, both of Shizuoka, Japan

[73] Assignee: Kabushiki Kaisha TEC, Shizuoka, Japan

[21] Appl. No.: 292,255

[22] Filed: Aug. 18, 1994

[30] Foreign Application Priority Data

Aug. 20, 1993 [JP] Japan .................................... 5-206279

[51] Int. Cl.$^6$ .................................................... H01L 41/22

[52] U.S. Cl. .................... 29/25.35; 29/890.1; 346/140.1; 427/100

[58] Field of Search ............................... 29/25.35, 890.1; 427/100; 346/140.1; 342/68

[56] References Cited

U.S. PATENT DOCUMENTS 5,193,256 3/1993 Ochiai .

FOREIGN PATENT DOCUMENTS 0485241 5/1992 European Pat. Off. .
0535772 4/1993 European Pat. Off. .
0543202 5/1993 European Pat. Off. .
5-96727 4/1993 Japan .

*Primary Examiner*—Carl E. Hall
*Attorney, Agent, or Firm*—Oblon, Spivak, McClelland, Maier, & Neustadt, P.C.

[57] ABSTRACT

A method of fabricating an ink jet print head which jets ink through an ink jet nozzle by pressurizing the ink supplied to a pressure chamber from an ink supplying portion, including applying flowable resin on a surface of a piezoelectric member polarized along a thickness thereof; forming a low rigidity member having a rigidity less than that of the piezoelectric member by curing the resin; grinding a surface of the low rigidity member; forming a plurality of grooves extending from the surface of the low rigidity member to an inside of the piezoelectric member; forming electrodes on the entire inner surface of the grooves; and sticking a top plate on the ground surface to close an opening of the grooves, thereby forming a plurality of pressure chambers communicating with an ink supplying portion and the ink jet nozzle. Since the low rigidity member is cured before it is ground, the proportion of the height of the low rigidity member and the piezoelectric member is equalized. As a result the jetting characteristics are improved.

10 Claims, 8 Drawing Sheets

METHOD OF FABRICATING INK JET PRINT HEAD

BACKGROUND OF THE INVENTION

1. Field of the Invention

This invention relates to a method of fabricating an on-demand ink jet print head, and more particularly to a method of fabricating an ink jet print head in which a low-rigidity member having a rigidity lower than that of a piezoelectric member constitutes a part of a side wall of a pressure chamber.

2. Description of the Related Art

Conventional ink jet print heads are disclosed in Japanese Patent Laid Open No. Hei 5-64893 and Japanese Patent Laid Open No. Hei 5-96727. The structure of the ink jet print head will be described hereinafter in a fabricating process order, following which the operation thereof will be described.

First, as shown in FIG. 6 (A), a predetermined gap is produced between a base plate 1 such as a glass plate and a piezoelectric member 2 which is polarized along the thickness thereof, and adhesive is used to fill up the space between the base plate 1 and the piezoelectric member 2. After that the adhesive is cured to form an adhesive layer 3 between the base plate 1 and the piezoelectric member 2.

Next, as shown in FIG. 6 (B), a plurality of grooves 4 are cut in the surface of the piezoelectric member 2 so that the grooves 4 extend into the adhesive layer 3 and side walls 5 are formed on both sides of the grooves 4. Then, electrodes 6 are formed on an inner surface of the grooves 4.

Further, as shown in FIG. 6 (C), a top plate 7 is stuck to the surface of the piezoelectric member 2. The top plate 7 includes an ink supplying groove 9 (see FIG. 7) formed therein. Through this process, the upper openings of the grooves 4 are closed by the top plate 7, so that the side walls 5 and top plate 7 define a plurality of pressure chambers 8.

After that, as shown in FIG. 7, an orifice plate 11 is stuck to the sides of the base plate 1, adhesive layer 3 and piezoelectric member 2. An orifice plate 11 is provided with a plurality of orifices 10 each of which serves as an ink jet nozzle. Thus, the ink jet print head is completed.

Next, the operation of the ink jet print head thus constructed will be described hereinafter. FIG. 8 is a cross sectional view showing a part of the ink jet print head. In FIG. 8, a central pressure chamber is designated by reference numeral **8*b*, a left side pressure chamber by reference numeral 8*a*, and a right side pressure chamber by reference numeral 8*c*. An example of the operation of jetting the ink from the central pressure chamber 8*b*** will be described.

Electric fields are generated on the side wall 5 between the central pressure chamber **8*b* and the left pressure chamber 8*a* and the side wall 5 between the central pressure chamber 8*b* and the right pressure chamber 8*c*, in opposite directions. Then, the walls 5 are deformed such that the volume of the central pressure chamber 8*b* is increased. This reduces the internal pressure of the central pressure chamber 8*b* to suck ink from the ink supplying groove 9. In this case, though the right and left pressure chambers 8*a*, 8*c* are compressed, the right and left pressure chambers are prevented from jetting ink because the voltage applied to the electrodes 6 is gradually increased to apply the electric field so as to gradually decrease the volume of the right and left pressure chambers 8*a*, 8*c*. In this stage, the electrodes 6 are grounded immediately, then the volume of the central pressure chamber 8*b* is rapidly decreased, so that the internal pressure of the central pressure chamber 8*b* is rapidly increased. Thus, the central pressure chamber 8*b* jets ink through the orifice 10**.

In this case, each side wall 5 defining the pressure chamber 8 is made of the piezoelectric member 2 and the adhesive layer 3 having a rigidity lower than that of the piezoelectric member 2, so that resistance against strain of the piezoelectric member 8 is reduced, thus it is possible to increase the amount of strain of the piezoelectric member 2. Thus, the jetting characteristics are improved.

Next, problems of this conventional art will be described hereinafter. When fabricating the ink jet print head, it is necessary to form the adhesive layer 3 in a predetermined thickness over an entire surface. However, since it is difficult to get a uniform curing and contraction action of the adhesive over a wide surface, a thickness $t_1$ of the adhesive layer 3 varies, so that, as shown in FIG. 9(A), the center of the piezoelectric member 2 is warped to be pulled by the adhesive layer 3. Even if the upper surface of the piezoelectric member 2 is evenly ground as shown with a dotted line 12, and after that the top plate 7 is stuck to the piezoelectric member 2 as shown in FIG. 9(B), a thickness $t_2$ of the piezoelectric member 2 of the side wall 5 defining the pressure chamber 8 and a thickness $t_3$ of the adhesive layer 3 of the side wall 5 may vary in places. Therefore, the displacement characteristics of the each side wall 5 become unequal when applying voltage to the electrodes 6, so that it is impossible that pressure chambers 8 uniformly jet ink.

SUMMARY OF THE INVENTION

The first object of the present invention is to provide a method for fabricating an ink jet print head which can uniformly jet ink among each pressure chamber.

The second object of the present invention is to provide a method for fabricating an ink jet print head which can prevent a grindstone for a grinding process from loading when grinding grooves form a pressure chamber.

The third object of the present invention is to provide a method for fabricating an ink jet print head which can form electrodes which have no failure such as pin holes on an inner surface of grooves forming a pressure chamber.

To achieve these objects described above, there is provided a method for fabricating an ink jet print head for jetting ink as droplets from a pressure chamber through an ink jet nozzle in response to a signal from an outside, comprising the steps of:

providing a piezoelectric member polarized along a thickness thereof as a piezoelectric member layer;

applying flowable resin on a surface of said piezoelectric member layer;

forming a low rigidity member layer having a rigidity less than that of said piezoelectric member layer by curing said resin;

grinding a surface of said low rigidity member layer;

forming a plurality of parallel grooves which extend from the surface of said low rigidity member layer to an inside of said piezoelectric member layer;

forming electrode layer on an surface of said grooves; and sticking a top plate to the ground surface of said low rigidity member layer to form pressure chambers.

BRIEF DESCRIPTION OF THE DRAWINGS

FIG. 2 (B) is a perspective view for use in describing process (d) following FIG. 2. (A);

FIG. 2 (C) is a perspective view for use in describing a masking process during an electrodes forming process, process (e), following FIG. 2 (B);

FIG. 3 (B) is a perspective view showing a state that the resist file is formed during an electrodes forming process, process (e), following FIG. 3 (A);

FIG. 4 (B) is a perspective view showing a state where the resist film is exfoliated during an electrodes forming process, process (e), following FIG. 4(A);

FIG. 4 (C) a perspective view showing a state where the ink jet print head is completed through process (f) following FIG. 4 (B);

FIG. 6 (B) is a cross sectional view showing a state where grooves are cut in the piezoelectric member and the adhesive layer as a process following FIG. 6 (A);

FIG. 6 (C) is a cross sectional view showing a state where a top plate is stuck to the upper surface of the piezoelectric member so as to close an opening of the grooves as a process following FIG. 6 (B);

FIG. 9 (B) is a cross sectional view showing the conventional ink jet print head.

DETAILED DESCRIPTION OF PREFERRED EMBODIMENTS

A first embodiment of the present invention is described with reference to FIGS. 1 through 4. An ink jet print head of this embodiment is fabricated through process (a) to (f) described below.

Figure 2A:
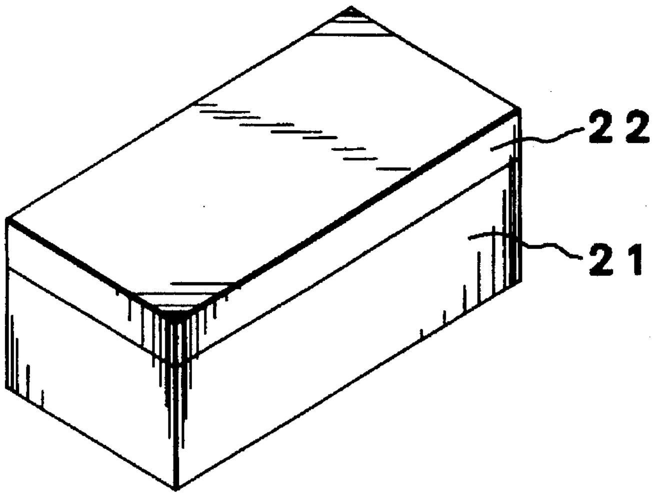
FIG. 2 (A) is a perspective view for use in describing process (a), (b) and (c) in the fabricating of the ink jet print head.
Figure 2B:
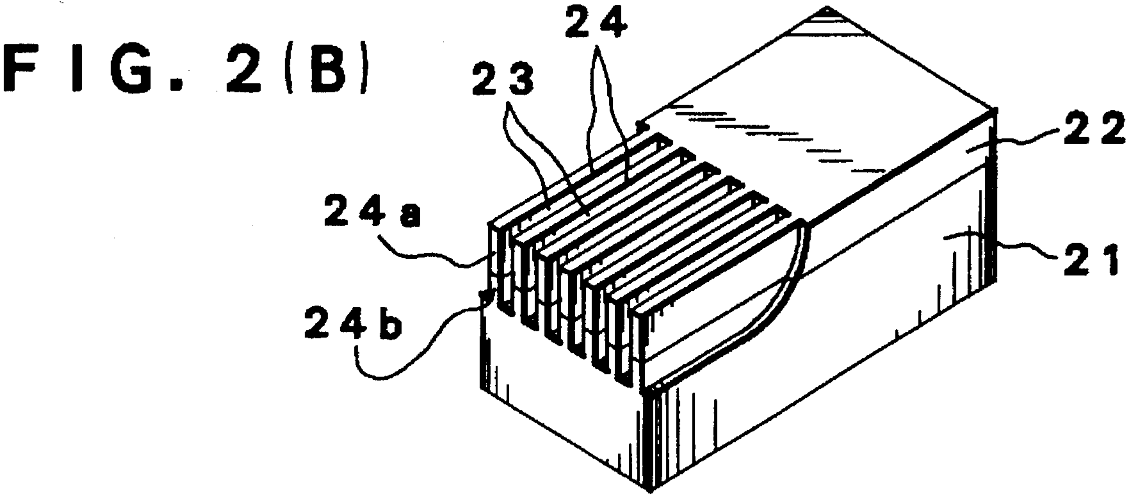
Figure 2C:
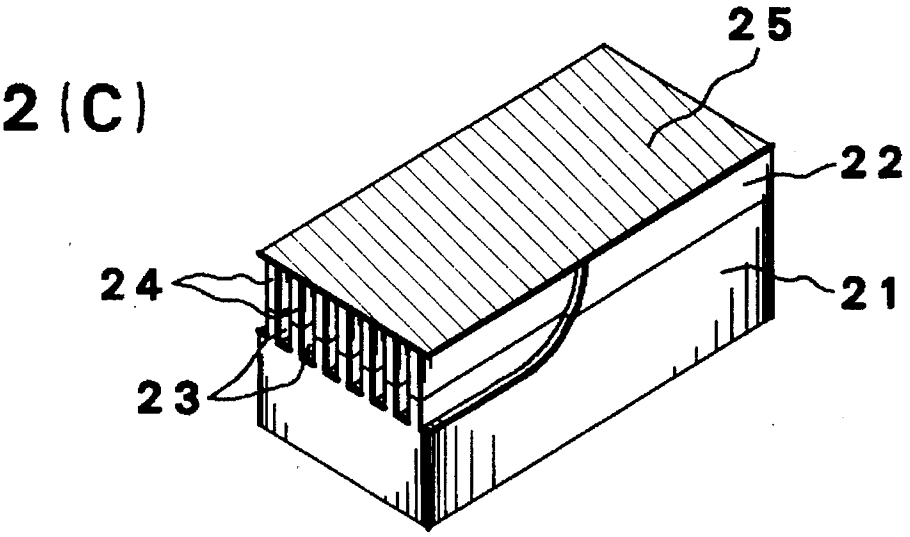

Process (a),

In the process (a), a flowable resin is applied to a surface of a piezoelectric member. As shown in FIG. 2 (A), the flowable resin which will become a low rigidity member 22 having a rigidity lower than that of the piezoelectric member 21 is applied to a surface of the piezoelectric member 21 which serves as a base plate. The piezoelectric member 21 is made of a piezoelectric ceramic such as one based on lead titanate or zirconic acid plumbum which is processed in a uniform thickness and polarized along the thickness thereof. The flowable resin is made of two different liquid mixing type epoxy resins containing mineral fillers (mica, silica, etc.) in view of adhesive strength, ease of post-processing, sticking strength of plating at an electrode forming process, coefficient of linear expansion and so on. This flowable resin is applied on the surface of the piezoelectric member 21 so as not to produce air bubbles.

Process (b),

Process (b) is to cure the above resin to form a low rigidity member having a rigidity less than that of the piezoelectric member 21. Namely, the low rigidity member 22 is formed on the piezoelectric member 21 by curing the resin (adhesive).

Process (c),

Process (c) is to grind the surface of the low rigidity member 22. In this process, the low rigidity member 22 is ground by using the surface of the piezoelectric member 21 as a reference. Thus, even if the thickness of the applied resin layer varies at process (a) and the thickness of the cured and constracted resin layer varies at process (b), the thickness of the low rigidity member 22 is equalized over an entire surface. In this case, since the resin contains mineral filler, a grindstone for a grinding process is prevented from loading.

Process (d),

Process (d) is to form a plurality of grooves extending from the surface of the low rigidity member 22 to the inside of the piezoelectric member 21 by a grinding process. Specifically, the piezoelectric member 21 is placed on a bed of a machine tool (not shown), and then, as shown in FIG. 2 (B), a plurality of grooves 23 extending from the surface of the rigidity member 22 to the inside of the piezoelectric member 21 are formed at a predetermined interval and depth. This process is conducted with a diamond wheel for cutting an IC wafer.

In this process, side walls 23 are formed on both side of each groove 24. Each wall 23 consists of an upper side wall section *24a* of the low rigidity member 22 and a lower side wall section *24b* of the piezoelectric member 21. In this case, since the dimension of the piezoelectric member 21 and the low rigidity member 22 are precisely determined at process (c), there is no variation in the depth of the grooves 24, the height of the side walls 23 defining the grooves 23, the proportion of the heights of the upper side wall section *24a* and the lower side wall section *24b*. Thus, the side walls 24 serving as a shearing actuator are precisely and easily formed.

Process (e),

Process (e) is to form electrodes 28 on the entire surface of the grooves 23 through electroless plating. First of all, cleaning, catalyzing, and accelerating processes are successively conducted as a pretreatment process before forming the electrodes 28 by electroless plating. The cleaning process is conducted to activate the plating surface and to provide the plating surface with hydrophilic property so that a catalyst agent, an accelerator agent and a plating agent easily intrude. The catalyzing process is conducted in order that complexing compound of Pd and Sn is absorbed to the surface of the grooves 23. Specifically, catalyzer process is conducted by immersing the piezoelectric member 21 into the catalyst agent, as a pretreatment process agent, containing palladium chloride, stannous chloride, concentrated sulfuric acid and so on. During the catalyzing process, complexing compound of Pd and Sn is absorbed to the surface of the upper side wall section 24*a* and lower side wall section 24*b*. The accelerating process is conducted to catalyze the complexing compound which is absorbed during the catalyzing process. The complexing compound which is absorbed to the side walls 24 becomes metallic Pd as catalyst.

Figure 3A:
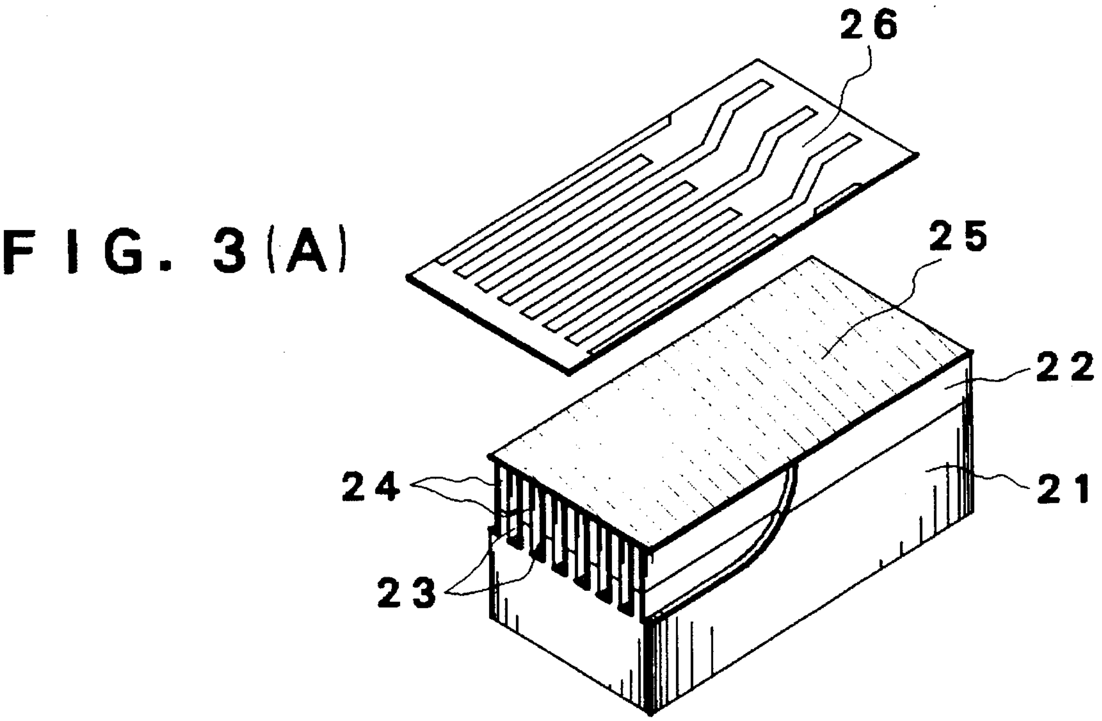
FIG. 3 (A) is a perspective view for use in describing a resist file forming process during an electrodes forming process, process (e), following FIG. 2 (C)
Figure 3B:
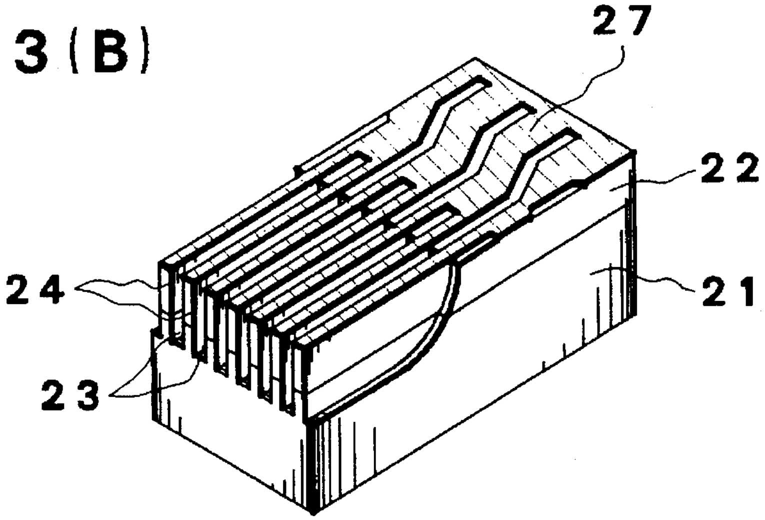

Next, the surface of the low rigidity member 22 is masked. Specifically, as shown in FIG. 2 (C), a dry film 25 is stuck to the surface of the low rigidity member 22. Then, as shown in FIG. 3 (A), a mask 26 for a resist is placed on the dry film 25 except a wire pattern forming portion, and exposure and developing processes are conducted. Thus, a resist film 27 is formed with the dry film 25 on the low rigidity member 22 except the wire pattern forming portion. Metallic Pd is exposed to the wire pattern forming portion of the low rigidity member 22 and a surface of the grooves 23.

Figure 4A:
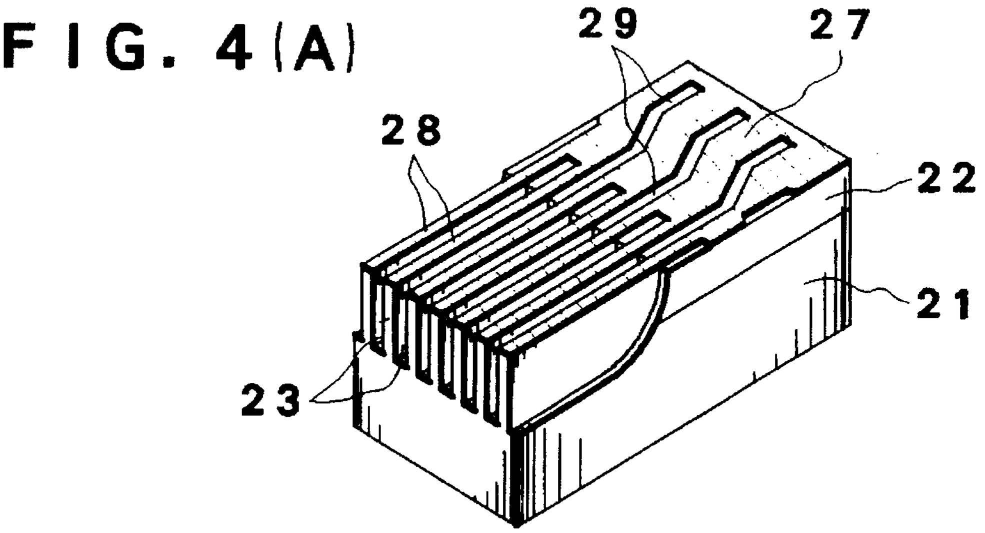
FIG. 4 (A) is a perspective view showing a state where an electroless plating is applied during an electrodes forming process, process (e), following FIG. 3 (B)
Figure 4B:
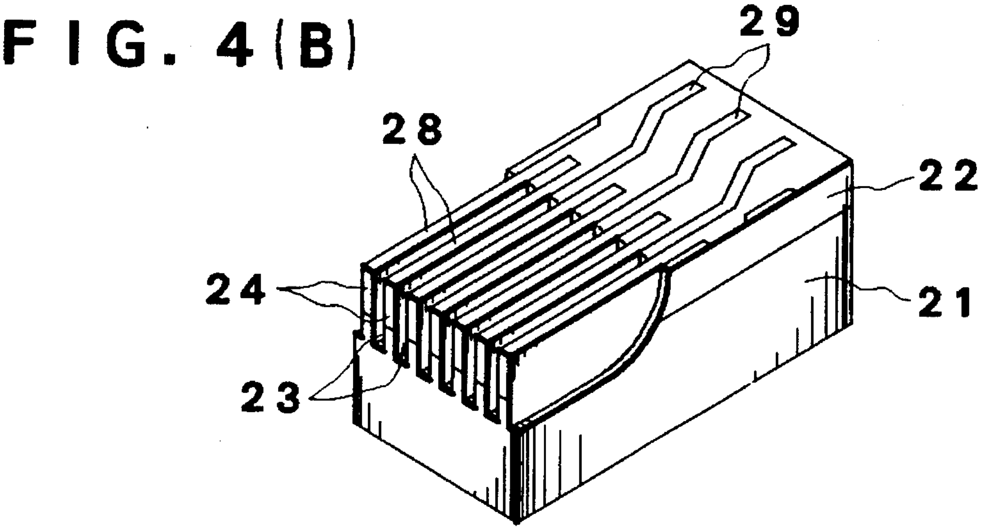
Figure 4C:
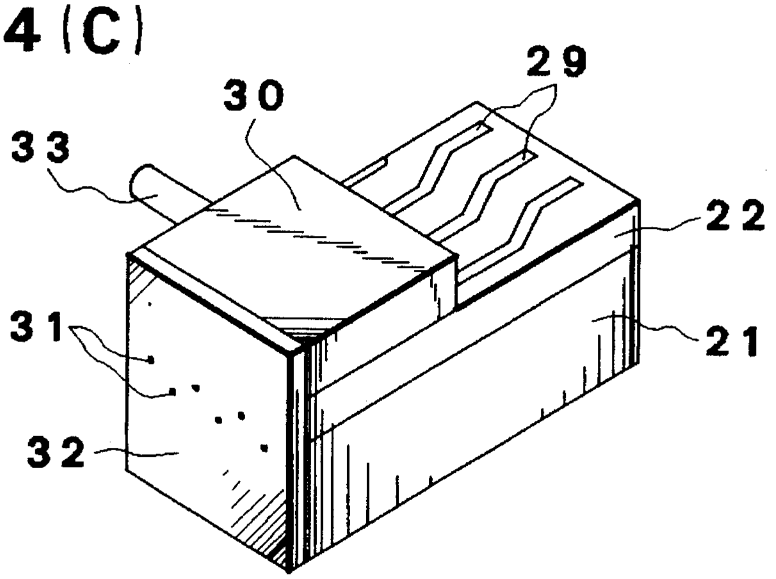

Next, an electroless plating is conducted by immersing the processed component described above into a plating agent. The plating agent consists of a main component of metal complex and a reducing agent, and additives such as a pH adjusting agent, a buffer solution, a complexing agent, an accelerator agent, a stabilizer, an improving agent etc.. When the plated component of the piezoelectric member 21 and the low rigidity member 22 is immersed in the plating agent described above, the metallic Pd is deposited as a catalyst, and, as shown in FIG. 4 (A), electrodes 28 are formed on the surface of the side walls 24 in the grooves 23 and the bottom surface of the grooves 23 and a wire pattern 29 connected to the electrodes 28 is formed on the low rigidity member 22.

In this case, it is possible to form electrodes 28 with no defect such as a pin hole etc. over an entire inner surface of the grooves 23, because, in the electroless plating, the plating also can be deposited on a narrow portion as long as the plating agent extends. Further, a large volume of components can be plated at one time, so that the fabricating cost can be reduced.

Process (f),

Process (f) is to form pressure chambers 34 by sticking a top plate 30 on the ground surface of the low rigidity member 22 to close the opening of the grooves 23 with the top plate 30. As shown in FIG. 4 (B), the resist film 27 stuck to the surface of the low rigidity member 22 is removed, following which, as shown in FIG. 4 (C), the top plate 30 is stuck to the surface of the low rigidity member 22. Thus, the grooves 23 are closed by the top plate 30, so that the pressure chambers 34 are formed (see FIG. 1 ). In this case, when sticking the top plate 30, the step is produced at the interface portion between the ends of the piezoelectric member 21 and the top plate 30. Therefore, the ends of the piezoelectric member 21 and the top plate 30 are ground, so that the step is eliminated. After that, an orifice plate 32, which is provided with ink jet nozzles 31 to be communicated to each groove 23, respectively, is stuck to the end surface of the piezoelectric member 21 and the low rigidity member 22. Then an ink supplying tube 33 is connected to the top plate 30 to supply ink to each groove 23 through an ink supply groove (not shown) in the top plate 30, thus the ink jet print head is completed.

Figure 1:
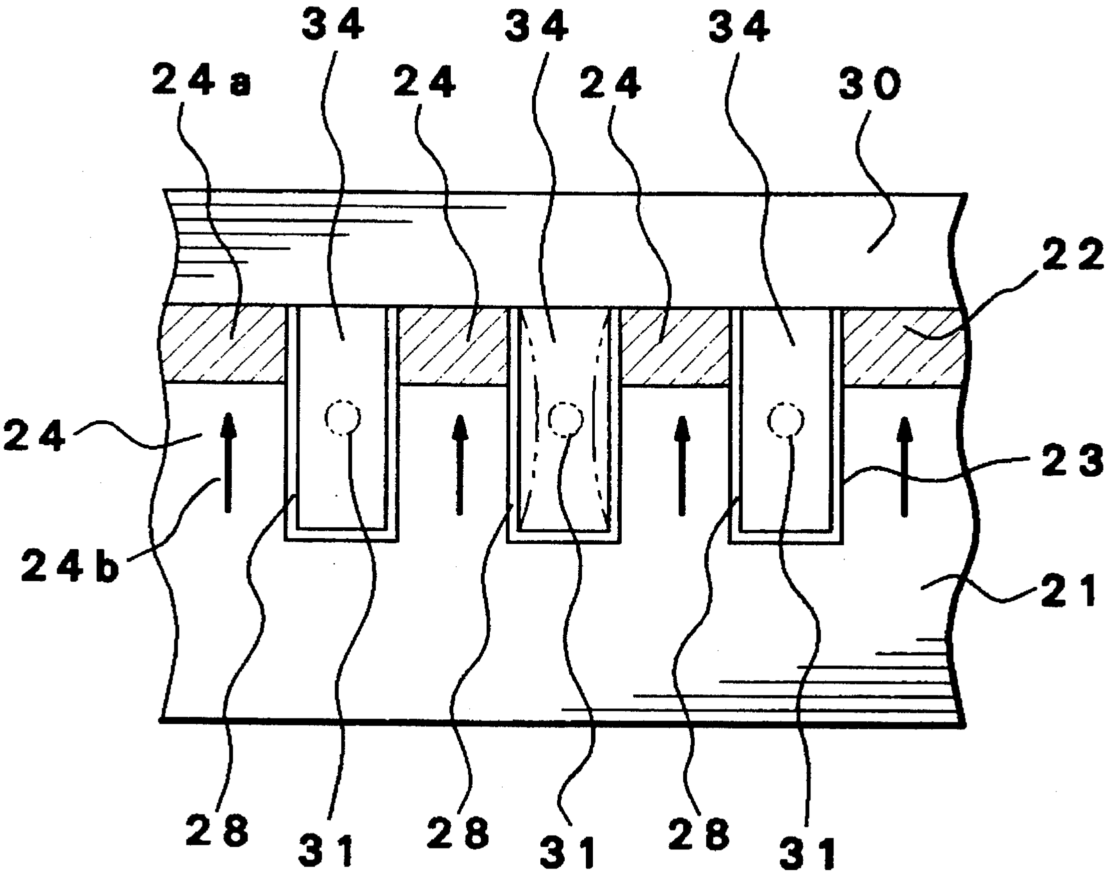
FIG. 1 is a front view showing an ink jet print head of the first embodiment according to the present invention before mounting an orifice plate.

FIG. 1 is a front view showing the ink jet print head without the orifice plate 32 fabricated as described above. In the drawing, the arrow designates a polarized direction.

Voltage is applied to the electrode 28 in the pressure chamber 34 desired to jet ink and the electrode 28 in the pressure chamber 34 on both side of the foregoing pressure chamber 34 to symmetrically deform the side walls 24 on both sides of the desired pressure chamber 34, thereby sucking or jetting ink. In this case, displacement of the side walls 24 is uniform, so that the pressure chamber 34 can uniformly jet ink. In FIG. 1, hypothetical lines on both side of the central pressure chamber 34 indicate a state that both side walls 24 are deformed to inside in order to increase the internal pressure of the central pressure chamber 34 to jet ink. In this case, since a part of each side wall 24 consist of the upper side wall section 24*a* of low rigidity member 22, resistance against the movement of the lower side wall section 24*b* of piezoelectric member 21 is reduced to enable the entire side wall 24 to greatly move. Thus, coefficient of jetting ink can be improved.

In the first embodiment, an adhesive is used as the resin and the low rigidity member 22 is formed by curing the adhesive. However, resin utilized as the low rigidity member 22 is not limited to an adhesive which is excellent in adhesive strength. It is possible to select resin as the low rigidity member 22 considering easy treatments in the following processes, sticking strength of deposition at an electrode forming process, and coefficient of linear expansion etc..

Figure 5:
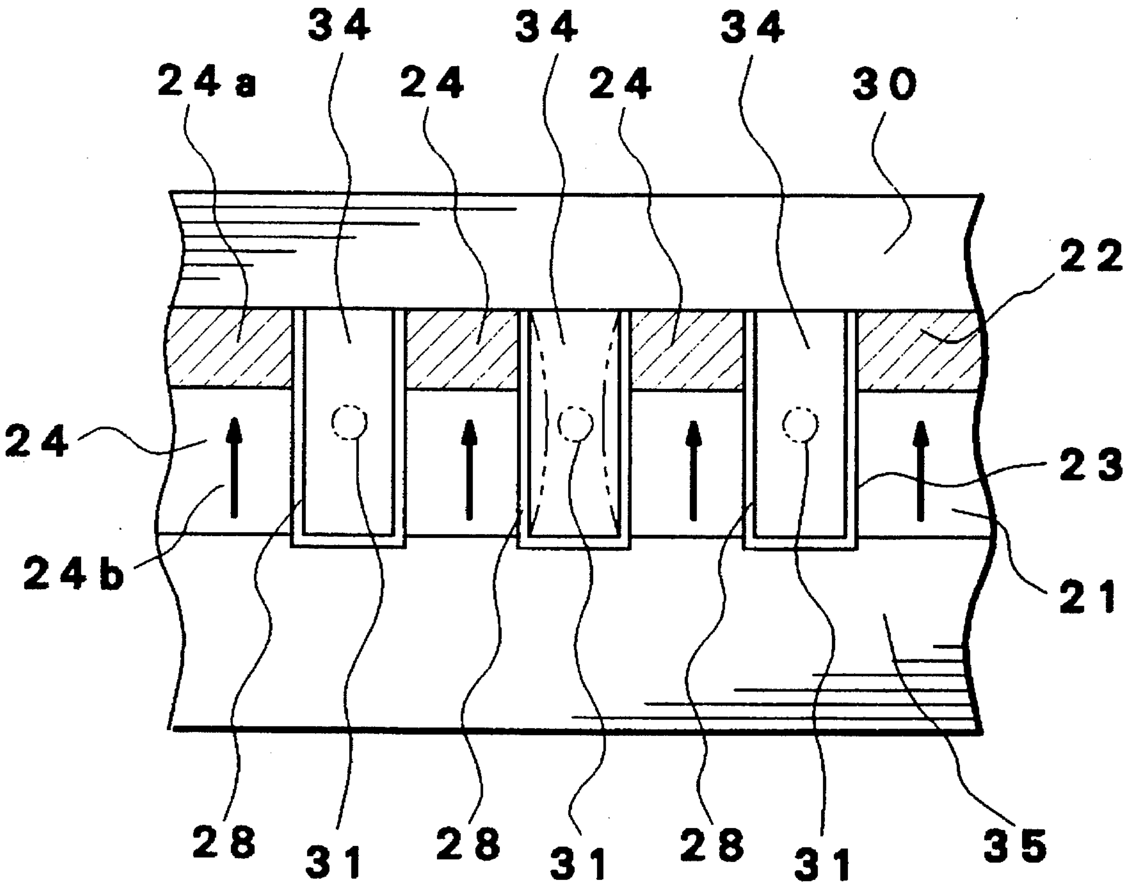
FIG. 5 is a front view showing an ink jet print head of the second embodiment according to the present invention before mounting an orifice plate.
Figure 6:
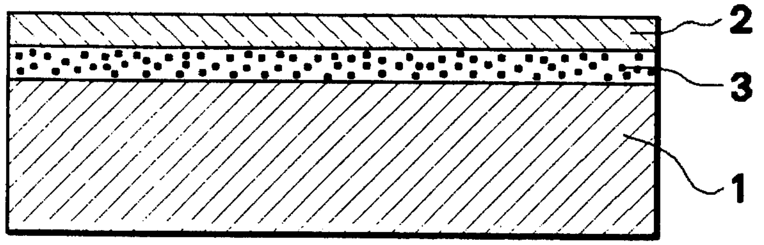
F I G. 6 (A) (PRIOR ART)
FIG. 6 (A) is a cross sectional view showing a state where a piezoelectric member is stuck to a base plate through an adhesive layer in a conventional method for fabricating an ink jet print head.
Figure 6:
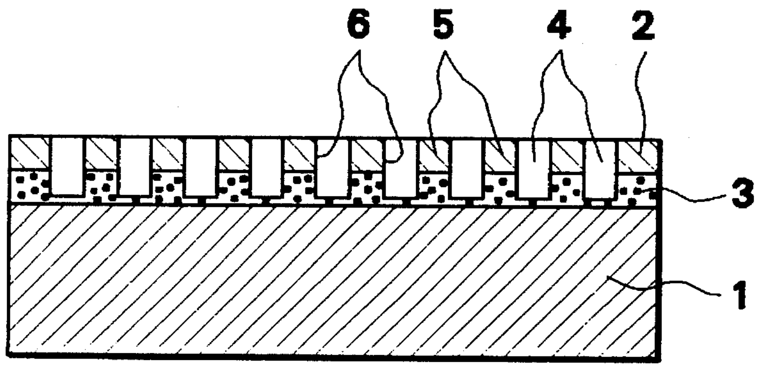
F I G. 6 (B) (PRIOR ART)
Figure 6:
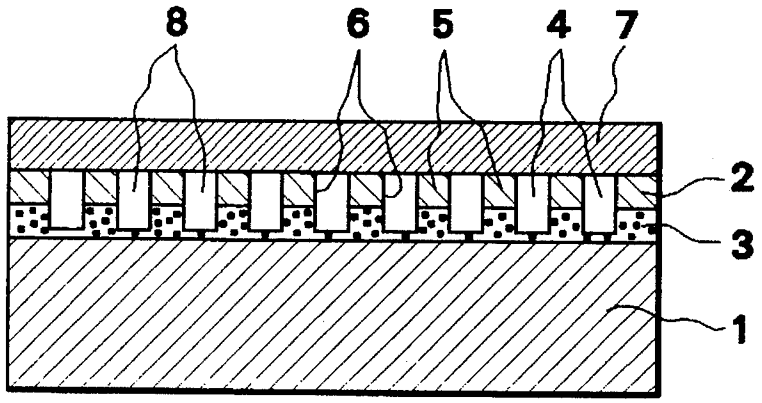
F I G. 6 (C) (PRIOR ART)
Figure 7:
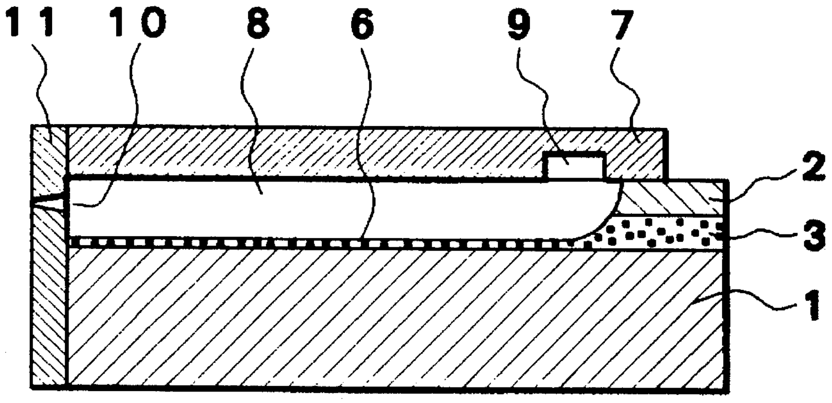
FIG. 7 (PRIOR ART)
FIG. 7 is a cross sectional view showing a state where an orifice plate is stuck to complete the ink jet print head as a process following FIG. 6 (C)
Figure 8:
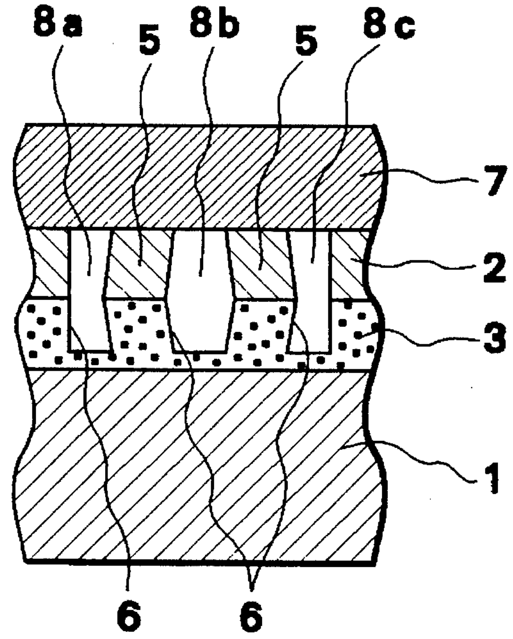
FIG. 8 (PRIOR ART)
FIG. 8 is sectional view showing a driving state of the ink jet print head shown in FIG. 7.
Figure 9A:
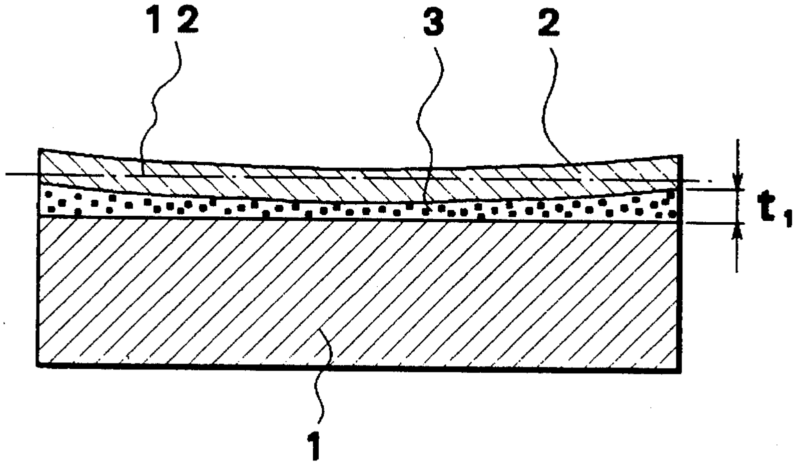
FIG. 9(A) (PRIOR ART)
FIG. 9 (A) is a cross sectional view showing a state where the piezoelectric member is warped in a conventional ink jet print head.
Figure 9B:
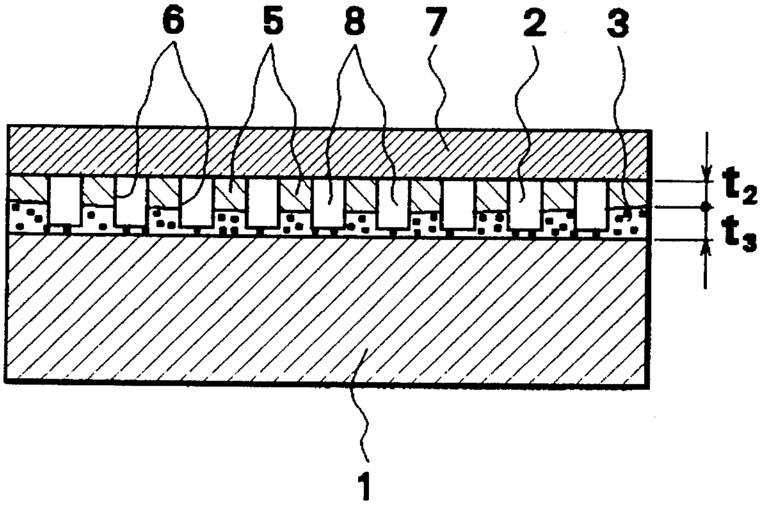
FIG. 9(B) (PRIOR ART)

The second embodiment of the present invention will be described with reference to FIG. 5. Similar portions are shown with the same reference numerals as that of the first embodiment and thus explanation thereof is not repeated. A plate like piezoelectric member 21 is stuck to an upper surface of a bottom plate 35. The bottom plate 35 has a predetermined thickness and is made of ceramics or glass having high rigidity and low thermal deformation provided by means of an adhesive resin. The adhesive resin may have an exopy resin as a main component of which has high adhesive strength and low viscosity. In this case, since the thickness of adhesive is thin, for example 1 μm, the contraction stress of the adhesive resin uniformly acts on the piezoelectric member 21, thereby preventing the piezoelectric member 21 from being warped. Thus, after the piezoelectric member 21 is stuck to the bottom plate 35, processes (a) to (f) are conducted as described above, and thus the ink jet print head is fabricated. However, it is noted that, the grooves 23 are formed by grinding the low rigidity member 22 and the piezoelectric member 21 over entire depth along the thickness thereof in the process (d).

Various changes in the above description may be made without effect on the invention.

What is claimed is:

1. A method of fabricating an ink jet print head for jetting ink as droplets from a pressure chamber through an ink jet nozzle in response to an outside signal, comprising the steps of:

providing a piezoelectric member as a piezoelectric member layer polarized along the thickness thereof;

applying flowable resin on a surface of said piezoelectric member layer;

forming a low rigidity member layer having a rigidity less than that of said piezoelectric member layer by curing said resin;

grinding a surface of said low rigidity member layer;

forming a plurality of parallel grooves which extend from the surface of said low rigidity member layer to an inside of said piezoelectric member layer;

forming electrode layer on an inner surface of said grooves; and sticking a top plate to the ground surface of said low rigidity member layer to form pressure chambers.

2. A method of fabricating an ink jet print head as claimed in claim 1, wherein said flowable resin includes two different liquid mixing type epoxy resins including mineral filler.

3. A method of fabricating an ink jet print head as claimed in claim 1, wherein said electrode layer is formed by electroless plating.

4. A method of fabricating an ink jet print head as claimed in claim 1, further comprising a step of sticking said piezoelectric member layer to a member having a low thermal deformation before said step of applying flowable resin on a surface of said piezoelectric member layer.

5. A method of fabricating an ink jet print head as claimed in claim 1, wherein said step of forming said grooves includes a step of forming grooves which extend to a side of said surface piezoelectric member layer and the low rigidity member layer.

6. A method of fabricating an ink jet print head as claimed in claim 5, further comprising the step of sticking an orifice plate having said ink jet nozzles to the side surface of said piezoelectric member layer and low rigidity member layer.

7. A method of fabricating an ink jet print head as claimed in claim 2, further comprising the step of sticking said piezoelectric member layer on a base member having a low thermal deformation.

8. A method of fabricating an ink jet print head as claimed in claim 7, wherein said step of forming said grooves includes a step of forming said grooves extending to a depth at which said base member exposes to said grooves.

9. A method of fabricating an ink jet print head for jetting ink as droplets from a pressure chamber through an ink jet nozzle in response to an outside signal, comprising the steps of:

applying flowable resin on a surface of a piezoelectric member layer polarized along the thickness thereof;

forming a low rigidity member layer having a rigidity less than that of said piezoelectric member layer by curing said resin;

grinding a surface of said low rigidity member layer;

forming a plurality of parallel grooves which extend from the surface of said low rigidity member layer to an inside of said piezoelectric member layer;

forming an electrode layer on an inner side surface of said grooves;

sticking a top plate to the ground surface of said low rigidity-member layer; and sticking an orifice plate having said ink jet nozzles on a side surface of said piezoelectric member layer and low rigidity member layer to form said pressure chamber.

10. A method of fabricating an ink jet print head as claimed in claim 9, wherein said flowable resin includes two different liquid mixing type epoxy resins including mineral filler.

* * * * *